United States Patent
Grillo et al.

(10) Patent No.: US 7,392,023 B2
(45) Date of Patent: *Jun. 24, 2008

(54) POWER SAVING IN A TRANSMITTER

(75) Inventors: Giuseppe Grillo, Eindhoven (NL);
Pepijn Van De Ven, Castletroy (IE);
Pieter Blanken, Eindhoven (NL);
Dominicus Martinus Wilhelmus Leenaerts, Eindhoven (NL); Franciscus Adrianus Cornelis Maria Schoofs, Eindhoven (NL)

(73) Assignee: NXP B.V., Eindhoven (NL)

( * ) Notice: Subject to any disclaimer, the term of this patent is extended or adjusted under 35 U.S.C. 154(b) by 94 days.

This patent is subject to a terminal disclaimer.

(21) Appl. No.: 10/550,340

(22) PCT Filed: Mar. 22, 2004

(86) PCT No.: PCT/IB2004/050301

§ 371 (c)(1),
(2), (4) Date: Sep. 22, 2005

(87) PCT Pub. No.: WO2004/086651

PCT Pub. Date: Oct. 7, 2004

(65) Prior Publication Data
US 2006/0246857 A1 Nov. 2, 2006

(30) Foreign Application Priority Data
Mar. 27, 2003 (EP) .................................. 03100801

(51) Int. Cl.
*H01Q 11/12* (2006.01)

(52) U.S. Cl. ............... 455/127.1; 455/343.1; 455/343.2; 455/574

(58) Field of Classification Search ............... 455/343.1, 455/343.2, 343.4, 574
See application file for complete search history.

(56) References Cited

U.S. PATENT DOCUMENTS 5,371,478 A * 12/1994 Ueda ........................... 330/285
6,298,222 B1 * 10/2001 Bergveld et al. ......... 455/127.5

(Continued)

FOREIGN PATENT DOCUMENTS

WO    WO 98/49771    11/1998

*Primary Examiner*—Lana Le
*Assistant Examiner*—Ajibola Akinyemi
(74) *Attorney, Agent, or Firm*—Peter Zawilski

(57) ABSTRACT

A transmitter comprises a power amplifier (PA) which has an amplifier powersupply input (PI) and an output (PAO) to supply a transmission signal (Vo) with an output power (Po). A power supply (PS) has power supply outputs (PSO1, PSO2) to supply a first power supply voltage (PV1) and a second power supply voltage (PV2). A switching circuit(SC) is arranged between the power supply outputs (PSO 1, PSO2) and the amplifier powersupply input (PI). A controller (CO) has an input to receive a power change command (PC) to control: first (i) the switching circuit (SC) to supply the first power supply voltage (PV1) to the amplifier power-supply input (PI), and the power supply (PS) to vary a level of the second power supply voltage (PV2), the level of the second power supply voltage (PV2) being lower or higher than a level of the first power supply voltage(PV1) if the power change command (PC) indicates that the output power has to decrease or increase, respectively, and secondly (ii) the switching circuit (SC) to supply the second power supply voltage (PV2) to the amplifier power-supply input (PI).

3 Claims, 4 Drawing Sheets

U.S. PATENT DOCUMENTS

| | | | |
|---|---|---|---|
| 6,501,331 B2* | 12/2002 | Adar | 330/51 |
| 6,586,988 B2* | 7/2003 | Arisawa | 329/311 |
| 6,757,526 B1* | 6/2004 | Sharp et al. | 455/127.1 |
| 2003/0040343 A1* | 2/2003 | Epperson et al. | 455/572 |
| 2003/0153368 A1* | 8/2003 | Bussan et al. | 455/574 |

* cited by examiner

POWER SAVING IN A TRANSMITTER

The invention relates to a transmitter, a method of transmitting, and a system comprising a mobile transmitter and a base station.

Such a transmitter may be a mobile wireless transmitter as disclosed in WO 98/49771. This prior art discloses a battery life extending technique for mobile wireless applications.

Extending battery life is a key concern for users and manufacturers of cellular telephones and other portable transceivers. The output power of the transceiver is made dependent on the strength of a received signal. If possible, a lower than a maximum output power is generated to decrease the power consumption and to extend the battery life. An operating voltage applied to a transmitter's power amplifier in the mobile wireless transceiver is dynamically controlled so as to obtain a high efficiency of the transmitter at all output power levels. In an embodiment, a highly efficient switching regulator is controlled by a control circuit to adjust the operating voltage for the power amplifier in the transmitter. The control circuit has as its input any of a variety of signals which reflect the actual output power of the transmitter, the desired output power, or the output voltage swing of the transmitter.

The operating voltage or power supply voltage is varied in accordance to the required average output power. Usually, the time to vary the operating voltage is limited. A high switching frequency of the power supply is required to change and settle the switching regulator voltage or power supply voltage within a short period of time. This high switching frequency decreases the efficiency of the power supply and increases the complexity of the design.

It is an object of the invention to provide a transmitter with power saving in which the requirements imposed on the power supply are less stringent.

Advantageous embodiments of the invention are defined in below.

In an example embodiment, there is a transmitter comprising: a power amplifier having an amplifier power-supply input and an output for supplying a transmission signal with an output power, a power supply having power supply outputs for supplying a first power supply voltage and a second power supply voltage, a switching circuit between the power supply outputs and the amplifier power-supply input, and a controller having an input for receiving a power change command to control: (i) the switching circuit to supply the first power supply voltage to the amplifier power-supply input, and the power supply to vary a level of the second power supply voltage to be lower than a level of the first power supply voltage if the power change command indicates that the output power has to decrease and to be higher than the level of the first power supply voltage if the power change command indicates that the output power has to increase, and (ii) the switching circuit to supply the second power supply voltage to the amplifier power- supply input.

In another example embodiment, there is a method in a transmitter comprising: a power amplifier having an amplifier power-supply input and an output for supplying a transmission signal with an output power , a power supply having power supply outputs for supplying a first power supply voltage and a second power supply voltage and a switching circuit arranged between the power supply outputs and the amplifier power-supply input, in response to a received power change command, the method comprising successively controlling the switching circuit to supply the first power supply voltage to the amplifier power-supply input and the power supply to vary a level of the second power supply voltage to be lower than a level of the first power supply voltage if the power change command indicates that the output power has to decrease and to be higher than the level of the first power supply voltage if the power change command indicates that the output power has to increase and controlling the switching circuit to supply the second power supply voltage to the amplifier power-supply input.

In yet another example embodiment, there is a system comprising a base station and a transmitter comprisinig: a power amplifier having an amplifier power-supply input and an output for supplying a transmission signal with an output power, a power supply having power supply outputs (PSO1, PSO2) for supplying a first power supply voltage and a second power supply voltage, a switching circuit arranged between the power supply outputs (PSO1, PSO2) and the amplifier power-supply input , and a controller having an input for receiving a power control signal from the base station to supply a power change command to control: (i) firstly, the switching circuit to supply the first power supply voltage to the amplifier power-supply input, and the power supply to vary a level of the second power supply voltage to be lower than a level of the first power supply voltage if the power change command indicates that the output power has to decrease and to be higher than the level of the first power supply voltage if the power change command indicates that the output power has to increase, and (ii) secondly, the switching circuit to supply the second power supply voltage to the amplifier power supply input during a transition period occurring at an end of a present one of the time slots (n−1, n, n+1) and a start of a next one of the time slots (n−1, n, n+1).

The transmitter in accordance with the invention comprises a power amplifier which supplies a transmission signal with a predetermined output power. The power amplifier has an amplifier power-supply input to receive a power supply voltage.

For example, in state of the art mobile and wireless communication schemes, the average output power of the power amplifier is set by the network. As a consequence, the power amplifier need not operate continuously at maximum output power. For example, in (W)-CDMA (Code Division Multiplex Access) systems, usually a 10 dB lower output power is required. The output power is varied in order to cope with the communication requirements. For example, in (W)-CDMA systems, the output power is varied in order to maximize the cell capacity. The base station measures the received power from the handset and sends commands to the handset to adjust the output power to a desired value. This is called Power Control Loop, an example is described for UMTS in ETSI 2001, UMTS TETRA standard, chapter TS125.101, pages 11-13 and ETSI 2001, UMTS TETRA standard, chapter TS125.214, pages 10-20. In an UMTS compatible handset, the power supply voltage has to change and settle within 50 microseconds. It is also possible to use other triggers to change the output power and to adapt the power supply voltage accordingly.

The power supply has power supply outputs to supply a first power supply voltage and a second power supply voltage. A switching circuit is arranged between the power supply outputs and the amplifier power-supply input. A controller has an input for receiving a power change command. The controller controls the switching circuit to supply the first power supply voltage to the amplifier power-supply input, and controls the power supply to vary a level of the second power supply voltage in accordance with the power change command. The level of the second power supply voltage is lower than a level of the first power supply voltage if the power change command indicates that the output power has to decrease. The level of the second power supply voltage is higher than a level of the first power supply voltage if the power change command indicates that the output power has to increase.

When the power amplifier has to deliver the changed output power level, the second power supply has been changed to the appropriate value, and the controller controls the switching circuit to supply the second power supply voltage to the amplifier power-supply input. When a next command is received to adapt the output power, the first power supply voltage is first varied to the appropriate value and than selected.

Thus, due to the availability of both the first and the second power supply voltage, it is possible to adapt the level of the power supply voltage not used by the power amplifier before this power supply voltage is actually supplied to the power amplifier. Consequently, the period of time during which the power supply has to vary the level of the power supply voltage may be longer than in the prior art In the prior art, only a single power supply voltage is present of which the level has to be changed within the short time frame. This is especially true when the output power has to decrease from a particular future instant onwards. It is not allowed to decrease the power supply voltage before this particular future instant. From the particular future instant, only a short period of time is available to decrease the level of the power supply voltage. In the transmitter in accordance with the invention it is possible to decrease the power supply voltage not used before this particular future instant and to switch over to this correct voltage level during the short period of time available.

In an example embodiment, the transmitter is a handheld apparatus such as a GSM phone which further comprises a receiving circuit to receive commands from a base station. The base station detects the power received from the handheld apparatus and transmits codes indicating to the handheld at which output power the handheld should transmit. In favorite transmission situations or when near to the base station, a lower output power suffices. The control of the output power of the handheld apparatus by the base station has the advantage that the base station is able to monitor the complete system. It is even possible to optimize the cell capacity.

In an example embodiment, the transmitter operates in a transmission system based on time slots. The output power of the transmitter is expected to be changed during transition periods which cover the end and/or the start of two successive time slots. The base station transmits power change commands to the handheld transmitter which indicate what predetermined output power is required during the next transmission slot The control circuit controls the power supply to change the power supply voltage which is not supplied to the power amplifier of the transmitter, preferably as soon as the power change command is received. Usually, the power change command is received well in time before the transition period which starts before the end of the time slot. After the start of the transition period, thus before or after the end of the current time slot, when the not yet used power supply has the required level to fit the required predetermined output power, the control circuit controls the switch circuit to switch over to this not yet used power supply voltage which now has the correct level. This power supply voltage will be used during the next time slot. If again a power change command is received, the level of the now not used power supply voltage will be changed and this changed power supply voltage will be switched to the power amplifier after the start of the next transition period.

Thus, the power supply has to change the level of one of the power supply voltages in a period of time which is much longer than the transition period. Consequently, the power supply will become less complex and easier to design.

In an example embodiment, the not used power supply voltage is changed as soon as possible after receiving the command. This has the advantage that if the power supply voltage of the power amplifier is switched over during the first occurring transmission period, the time available for changing the power supply voltage is as large as possible. If this is done both for a decreasing and an increasing output power, the power consumption of the power amplifier is always optimally selected to fit the output power required.

Alternatively, it might however be advantageous to keep the power supply voltage supplied to the power amplifier constant for a number of time slots if is indicated that the output power should decrease. This is not optimal in terms of efficiency, but it may be acceptable if it occurs during a minor part of the time frame under consideration. Only two power supply voltages are required. An algorithm defining an embodiment in accordance with the invention based on this approach is elucidated in the now following.

The power supply voltage supplied to the power amplifier is kept constant as long as no power change command is received.

If the power change command indicates that the output power has to decrease, it is checked whether the non-selected power supply voltage is lower than the selected power supply voltage, and whether the non-selected power supply voltage is high enough such that the power amplifier is able to supply the output power requested during the next time slot. If the non-selected power supply voltage fits these requirements, it will be selected. If the non-selected power supply voltage does not fit these requirements, the currently selected output voltage will still be used in the next time slot However the power supply will at least temporarily be controlled to allow the power supply capacitor to be discharged by the current drawn by the power amplifier until the required lower level is reached.

If the power change command indicates that the output power has to increase, it is checked whether the non-selected power supply voltage is higher than the selected power supply voltage and whether the non-selected power supply voltage is high enough such that the power amplifier is able to supply the output power requested during the next time slot. If the non-selected power supply fits these requirements, it will be selected at the next transition period. If the now selected power supply voltage has a value which is too high to be able to supply the power requested, again the selected power supply voltage may be allowed to decrease until the required minimum value fitting the output power optimally is reached. If the non-selected power supply does not fit these requirements, its level is increased immediately when the power change command is received, and is then selected at the next transition period to be used as the power supply voltage for the power amplifier.

In an example embodiment, the power supply supplies three power supply voltages. One of the power supply voltages is supplied to the power amplifier. The levels of the two other power supply voltages are controlled such that one has a level higher than the level of the power supply voltage supplied to the power amplifier while the other has a level lower than the level of the power supply voltage supplied to the power amplifier. At the instant required, the switching circuit selects the power supply voltage with the higher level if the output power has to increase, or the switching circuit selects the lower power supply voltage if the output power has to decrease. Thus it is possible to immediately switch over to the required level of the power supply voltage at the instant required. The instant required usually is the start of a next transition period. This has the advantage that it is not required to change the level of the power supply voltage within a short time period lasting from the instant it is known that the output power should be changed and the start of the next transition period.

After selecting one of the power supply voltages which were not used in the previous time slot, the level of one of the other, not selected, power supply voltages is adapted, or the levels of both the other, not selected, power supply voltages are adapted such that one of these power supply voltages has again a level above the level of the selected power supply voltage and the other one has a level which is below the level of the selected power supply voltage. Thus, of the non-selected power supply voltages one has or is made to have a lower level and one has or is made to have a higher level than the selected power supply voltage. Consequently, it is possible to directly switch to the correct power supply voltage. If the maximum or minimum value of the possible power supply voltages is reached, it is of course not possible to supply one of the non-selected power supply voltages with a level lower than the minimum value or higher than the maximum value unless a special power converter topology is provided.

In an example embodiment, the transmitter operates in a transmission system based on time slots. The controller controls, in a time slot wherein the output power has to be changed, the level of the one of the non-selected power supply voltages which has the largest difference with the level of the selected power supply voltage. This has the advantage that only a single power supply voltage has to be varied at a time.

In an example embodiment, the transmitter again operates in a transmission system based on time slots. The controller controls, in a time slot wherein the output power has to be changed, the level of both the non-selected power supply voltages. The level of the non-selected power supply voltage which is nearest to the level of the selected power supply voltage crosses the level of the selected power supply voltage. Thus, if the non-selected power supply voltage which has the nearest level has a level below the level of the selected power supply voltage, the level of this non-selected power supply will be made larger than the level of the selected output voltage. The level of the other non-selected output voltage has to increase to have the same difference value to the selected output voltage level as in the earlier time slot. Although now two levels have to vary, the maximum amount of variation of the output voltage levels becomes smaller.

These and other aspects of the invention are apparent from and will be elucidated with reference to the embodiments described hereinafter.

Figure 4:
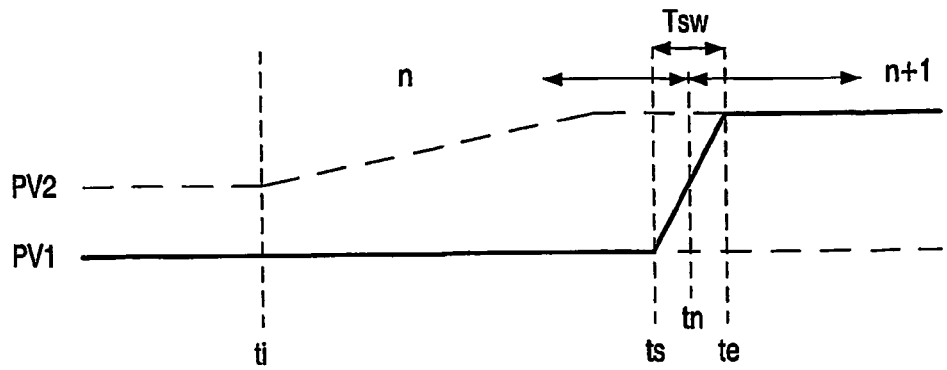
Figure 5:
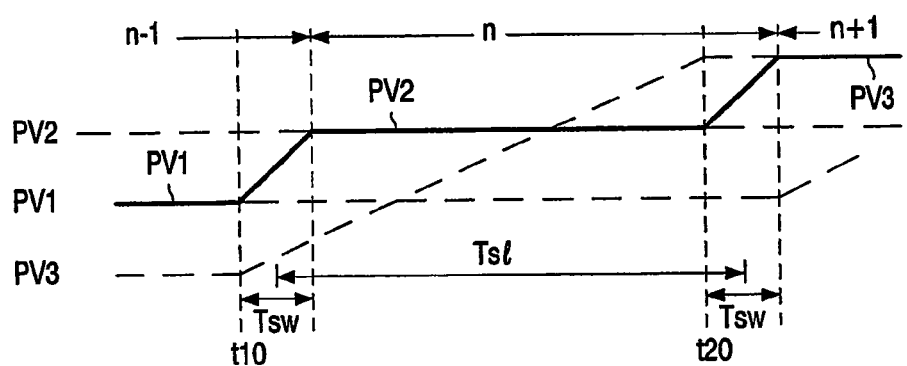
Figure 6:
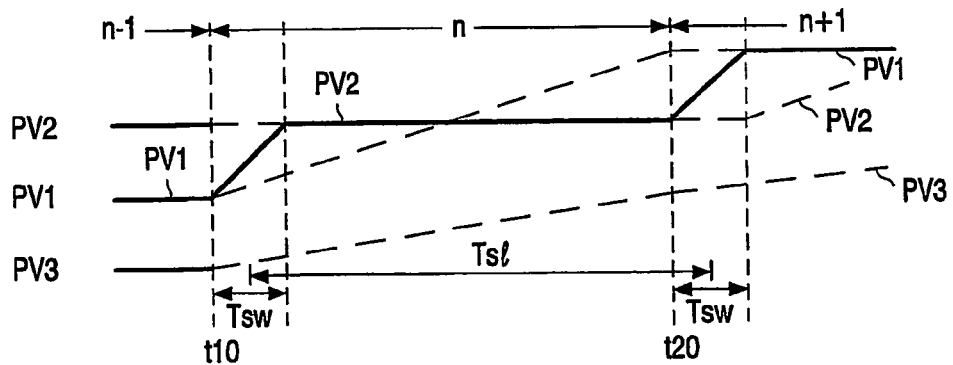
Figure 7:
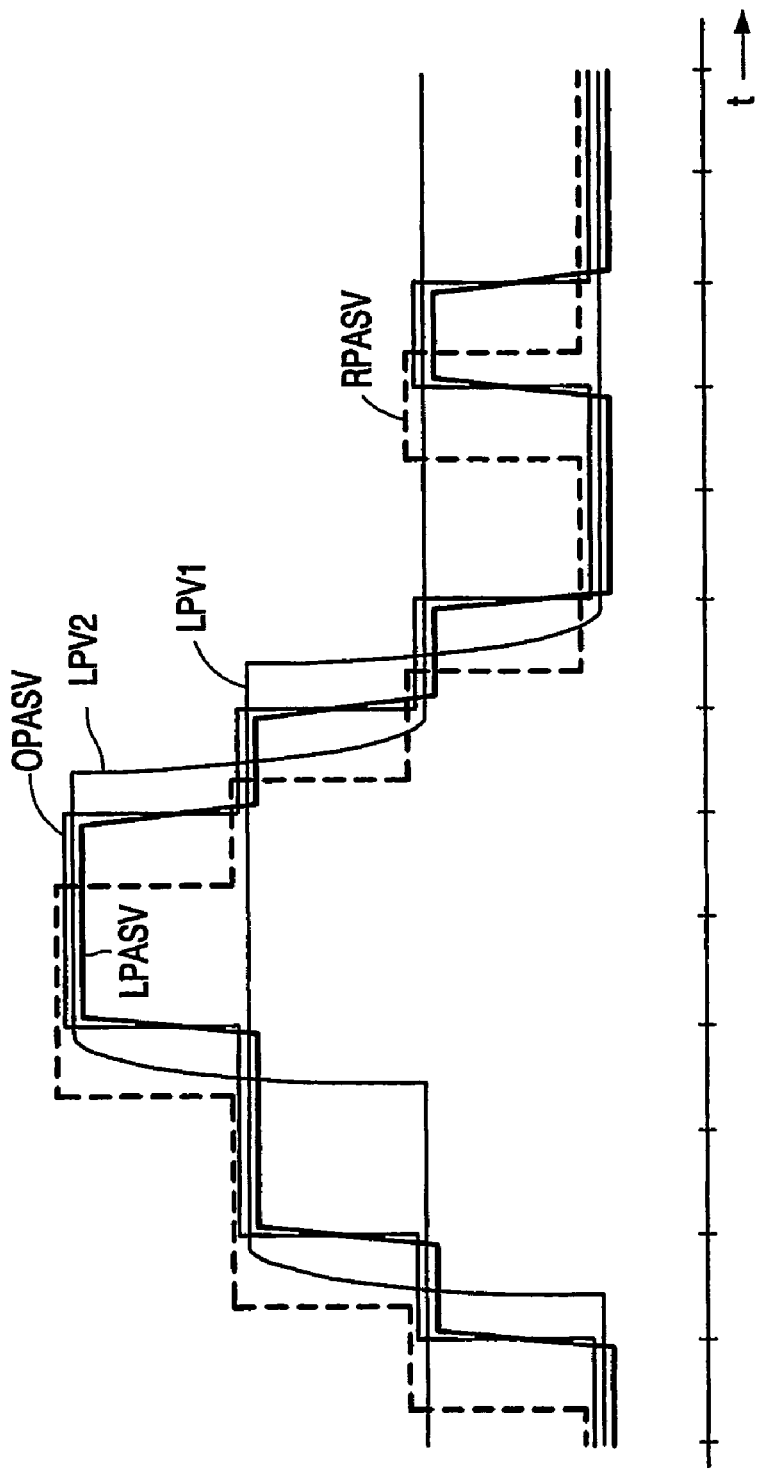
Figure 8:
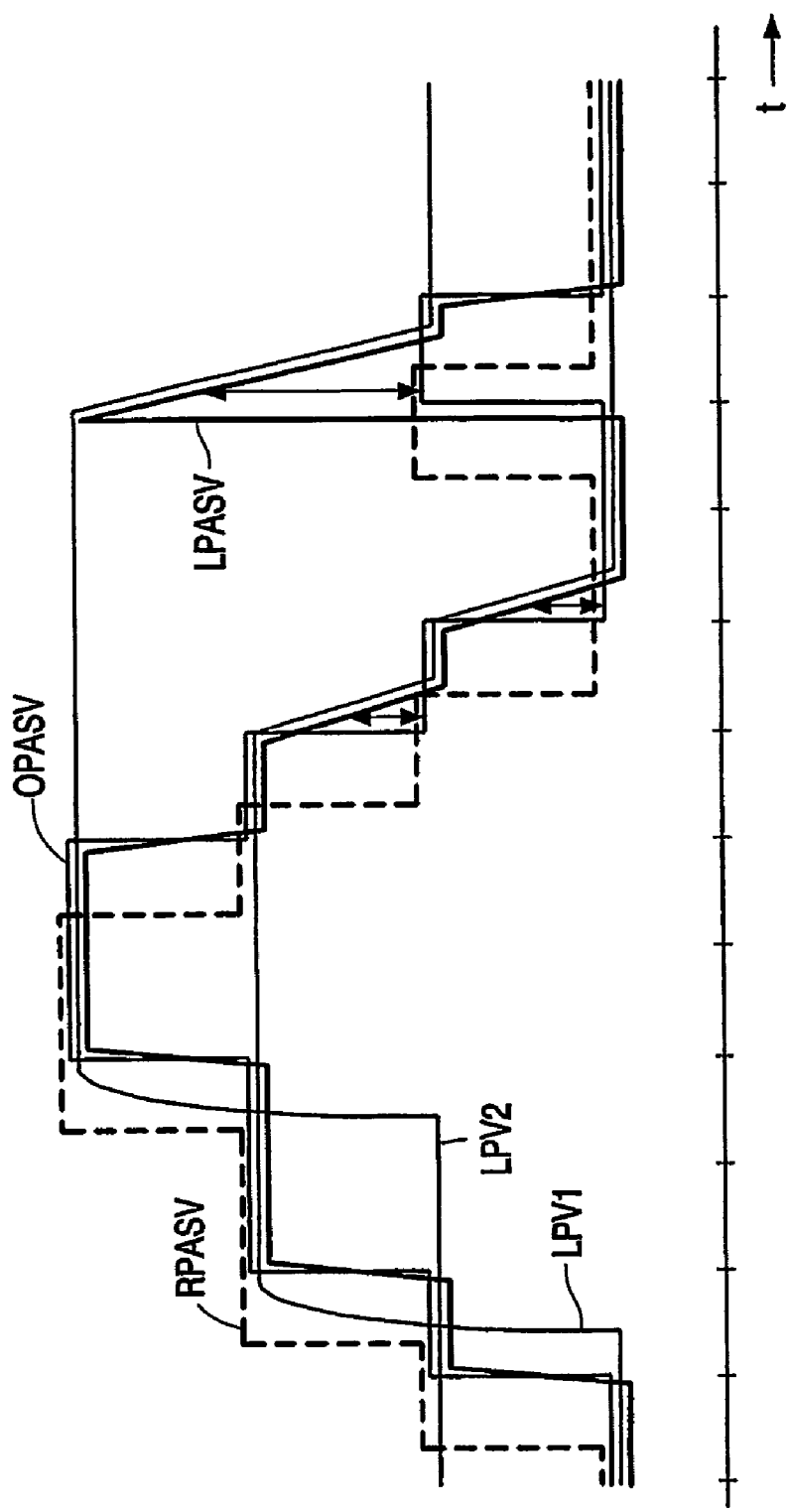

FIG. 4 shows an embodiment in accordance with the invention wherein a single power supply voltage is varied, FIG. 5 shows embodiment in accordance with the invention wherein two power supply voltages are varied, FIG. 6 shows another embodiment in accordance with the invention wherein two power supply voltages are varied, and FIG. 7 shows a variation of voltages in an embodiment in accordance with the invention, and FIG. 8 shows a variation of voltages in an embodiment in accordance with the invention.

The same references in different FIGS. refer to the same signals or to the same elements performing the same function.

Figure 1:
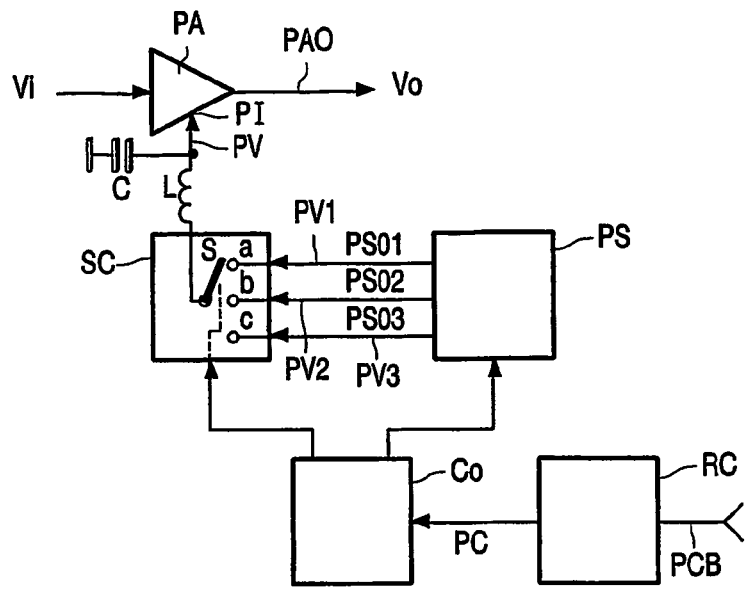
FIG. 1 shows a block diagram of a transmitter with power saving.

FIG. 1 shows a block diagram of transmitter with power saving. The power amplifier PA receives an input signal Vi and a power supply voltage PV at a power supply input PI, and supplies a transmission signal Vo. The power supply PS has power supply outputs PS01, PS02, PS03 to supply power supply voltages PV1, PV2, PV3, respectively, to the switching circuit SC. The switching circuit SC has a switch S which selects between the power supply voltages PV1, PV2, PV3 at the nodes a, b, c, respectively.

The controller CO receives a power change command PC to control the position of the switch S and the levels of the power supply voltages PV1, PV2, PV3. The power change command PC may be supplied by a receiving circuit RC which receives a power control signal PCB from the base station.

The power supply voltage selected by the switch S is supplied to the power supply input PI via an inductor L. A capacitor C is arranged between the power supply input PI and ground. The optional filter which comprises the inductor L and the capacitor C has two functions. Firstly, the ripple of the power supply voltages PV1, PV2, PV3 is filtered, and secondly, it supplies energy to the power amplifier during a time interval in which the switch S is not connected to any of the nodes a, b, c.

In general, the transmitter operates as elucidated in the now following. At a certain output power of the transmitter, the power supply voltage PV has the optimal value by selecting with the switch S the most appropriate one of the power supply voltages PV1, PV2, PV3. If the output power of the transmitter has to be adapted, the switch is controlled to select another one of the power supply voltages PV1, PV2, PV3 fitting the new output power best. Now, the levels of the power supply voltages (or voltage if only two instead of the three power supply voltages PV1, PV2, PV3 are used) which are not selected can be changed such that when a next time the output power of the transmitter has to be adapted, the appropriate power supply voltage or voltages PV1, PV2, PV3 are available. This will be elucidated in more detail with respect to FIGS. 4 to 6. It is of course possible to use more than three power supply voltages.

Figure 2:
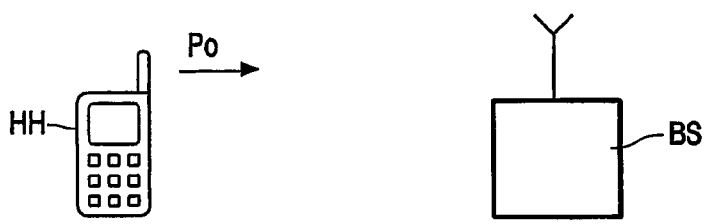
FIG. 2 shows a handheld and a base station.

FIG. 2 shows a handheld and a base station. The transmitter is a handheld HH, for example a GSM phone, which communicates with the base station BS. The power amplifier PA of the handheld HH generates the transmission signal Vo with an output power Po.

Figure 3:
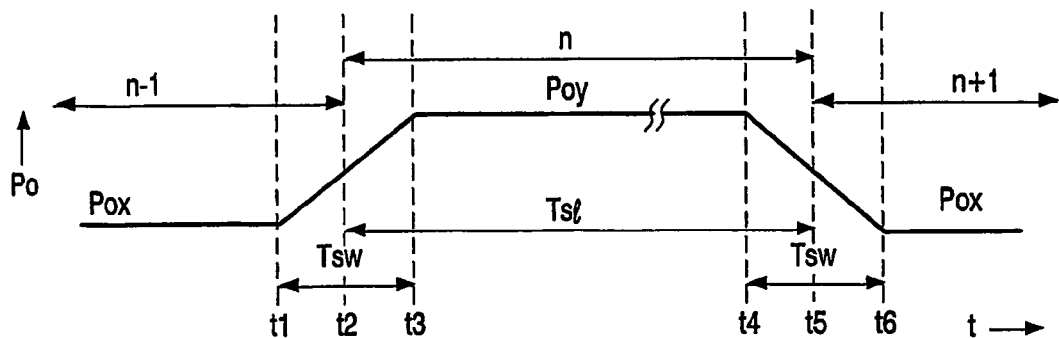
FIG. 3 shows an example of a change of the output power of the transmitter.

FIG. 3 shows an example of a change of the output power Po of the transmitter. In the power control loop, the base station BS receives the transmission signal Vo from the handheld HH and measures the received power of this signal. If required, the base station BS sends the power control signal PCB to the handheld HH to adjust the output power Po of the handheld HH to an appropriate level. FIG. 3 shows an example of the timing of the power control loop for a UMTS handset HH.

In modern communication systems such as the UMTS system, time slots are used. If three consecutive time slots n−1, n, n+1 are considered, during each one of the time slots n−1, n, n+1, the output power Pox, Poy of the transmission signal has a fixed value. Each time slot n−1, n, n+1 lasts a time slot period Tsl. A transition period Tsw is available at the end and/or the start of successive time slots n−1, n, n+1 to change the level of the output power Pox, Poy. In FIG. 3, the transition period Tsw overlaps the end and the start of two successive time slots. In other standards, the transition period Tsw may be positioned different, for example, the transition period Tsw may be positioned completely at the end of a time slot n−1, n, n+1, or completely at the start of a time slot n−1, n, n+1. The time slot n−1 lasts until instant t2, the time slot n lasts from instant t2 to instant t5, the time slot n+1 starts at instant t5. The transition period Tsw at the end of the time slot n−1 and the start of the time slot n lasts from instant t1 to instant t3, the transition period Tsw at the end of the time slot n and the start of the time slot n+1 lasts from instant t4 to instant t6.

Before instant t1, the handset supplies a transmission signal Vo with an output power Pox. At instant t1 the transition period Tsw starts. During the transition period Tsw lasting from instant t1 to instant t3 the output power has to change from Pox to Poy. Thus, during the next time slot n, from instant t3 onwards, the output power is Poy. Before the end of the time slot n, at instant t4, again a transition period Tsw starts. The output power changes from Poy to Pox such that at instant t6 within the time slot n+1, the output power is Pox again.

FIG. 4 shows an embodiment in accordance with the invention wherein a single power supply voltage is varied. With respect to FIG. 1, the power supply PS supplies only two power supply voltages PV1 and PV2. One of the power supply voltages PV1, PV2 is selected by the switch S to be supplied to the power amplifier PA, while the other, non-selected power supply voltage can be freely varied to obtain a suitable level.

Before instant ts during a present time slot n, the power supply voltage PV1 is selected by the switch S to be the power supply voltage PV of the power amplifier PA. The present time slot n lasts until instant tn. At instant ti, it becomes clear that the output power Po of the power amplifier PA has to be increased. For example, the base station BS may send the power control signal PCB, or the transmitter detects the signal strength of the signal received from the base station BS and adapts the output power Po of the power amplifier PA accordingly. The power supply voltage PV1 has a level which preferably optimally fits the output power Po of the power amplifier PA during the present time slot n. As the output power Po of the power amplifier PA has to be higher during the next time slot n+1, the level of the power supply voltage PV of the power amplifier PA should be higher during the next time slot n+1.

At the instant ti when it becomes clear that the output power Po of the power amplifier PA has to increase, the controller CO controls the power supply PS to increase the level of the power supply voltage PV2 which is not selected by the switch S to be supplied to the power amplifier PA. At instant ts, a transition period Tsw starts during which the power of the transmitter has to be increased. During this transition period Tsw, the control circuit CO controls the switch S to supply the voltage PV2 to the power amplifier PA. At instant ts, this voltage PV2 should have substantially the required higher level to enable the power amplifier PA to produce the required higher output power Po.

If, alternatively, at instant ti it becomes clear that the output power Po of the power amplifier PA has to decrease, the controller CO will control the power supply PS to decrease the level of the non-selected power supply voltage PV2. The level of the power supply voltage PV2 should have the required lower value at the instant ts.

Thus, the time available for the power supply PS to change the level of the non-selected power supply voltage PV2 is the period in time from instant ti to instant ts. In the prior art, where a single power supply voltage is available only, this single power supply voltage should be stable at the instant te, and thus the relatively short period in time from instant ts to te is available for the power supply PS to change and settle the level of the single power supply voltage. This relatively short period of time available complicates the design of the power supply PS. In the power supply PS in accordance with the invention, for example, the power supply may have a lower switching frequency and a smaller bandwidth of the power supply control loop. Consequently, the output voltage can be filtered easier than in the prior art.

A further drawback of the prior art is that the power supply PS has to vary the power supply voltage while it is supplying energy to the power amplifier PA. In the transmitter in accordance with the invention, the power supply voltage PV2 which is varied is not used by the power amplifier. Consequently, the design of the power supply PS can be further simplified because the specification on the variation of the power supply voltage PV2 is less stringent. For example, an overshoot on the level of the power supply voltage PV2 is allowed.

For example only, this embodiment in accordance with the invention can be applied to a UMTS handset HH. In the UMTS system, the transition period Tsw lasts 50 microseconds, and the period in time from instant ti to instant ts lasts 108 microseconds. Thus, in this embodiment in accordance with the invention, 158 microseconds are available to change the power supply voltage PV2 to the higher (or lower) level, which is 108 microseconds more than in the prior art.

FIG. 5 shows embodiment in accordance with the invention wherein two power supply voltages are varied.

In this embodiment, the power supply PS supplies three power supply voltages PV1, PV2 and PV3. Three successive time slots n−1, n and n+1 are shown. Now, by way of example, the transition periods Tsw occur at the end of the time slots n−1, n and n+1. During the time slot n−1, the controller CO controls the switch S to supply the power supply voltage PV1 to the power amplifier PA as the power supply voltage PV. The non-selected power supply voltage PV2 has a predetermined higher level than the selected power supply voltage PV1. The non-selected power supply voltage PV3 has a predetermined lower level than the selected power supply voltage PV1.

The output power of the power amplifier PA has a higher level during the time slot n than during the time slot n−1. During the transition period Tsw, but preferably at instant t10, the controller CO controls the switch S to select the power supply voltage PV2 as the power supply voltage PV of the power amplifier PA. During the time slot n, outside the transition period Tsw, the now non-selected power supply voltage PV1 is kept constant and the non-selected power supply voltage PV3 is varied to the predetermined higher level than the now selected power supply voltage PV2. Before the end of the time slot n, when the next transition period Tsw starts at instant t20, again a higher and a lower power supply voltage PV3, PV1 are available. If again the output power of the transmitter has to increase, during the transition period Tsw, preferably at instant t20, the changed power supply voltage PV3 is selected. During the time slot n+1, outside the transition period Tsw, the power supply voltage PV2 is kept constant, while the power supply voltage PV1 is changed to get the predetermined higher level than the now selected power supply voltage PV1. Before the end of the time slot n+1, again a higher and a lower power supply voltage PV3, PV1 will be available to select from.

In most wireless and communication standards, the power amplifier PA may have to change its output power during the periodically occurring transition periods Tsw. Usually, these standards specify that the average output power Po to be supplied during two consecutive time slots n−1 and n, may change a predetermined amount only, for example, ±1 dB or ±2 dB, or ±3 dB. Thus, each time the actual value of the output power Po of the power amplifier PA has to change, only two possibilities are envisaged. Consequently, the power supply voltage PV of the power amplifier PA in a next time slot n, has to be equal, or has to increase or decrease a fixed amount. If at all times besides the selected power supply voltage PV1 which is supplied to the power amplifier PA, also a power supply voltage PV2 with the required higher level and a power supply voltage PV3 with the required lower level is available, it is possible to select the required power supply voltage PV during the transition period Tsw preceding the next time slot n. For example, as indicated in FIG. 5, if the output power during the time slot n should be the predetermined amount higher, during the time slot n, the power supply PV2 is selected to be supplied to the power amplifier PA. During the time slot n the non-selected power supply voltages PV1 and PV3, if required, are adapted such that again a power supply voltage with a higher and a lower value than the selected power supply voltage PV2 is available. Thus even when the instant at which it becomes clear that another output power Po is required occurs at the start t20 of the transition period Tsw, it is possible to switch to the required power supply voltage without having to change the level of the power supply voltages PV1, PV2, PV3 within the short transition period Tsw.

It is possible to use more than three power supply voltages PV1, PV2, PV3, for example, five power supply voltages may be used. Of the four non-selected power supply voltages, two have different levels above the level of the selected power supply voltage and two have different levels below the level of the selected power supply voltage. This is advantageous because the control loop is able to order different steps of power change, such as, for example, ±1 dB or ±2 dB power changes. As the substantially optimal power supply voltages for these possible output powers are available, it is possible to switch over to the correct one of the power supply voltages within a short period of time. If seven different power supply voltages are generated, it is possible to immediately implement a switching to one of these power supply voltages fitting the corresponding one of seven possible output powers.

Thus, this embodiment in accordance with the invention is not dependent on when exactly the command PCB that the output power Po has to be changed is received, as long as this command PCB is available before the start of the next transition period Tsw, the most appropriate power supply voltage PV1, PV2, PV3 for the next time slot n+1 can be selected in time by controlling the switch S. This is important, because, in most telecommunication systems, it is the base station BS which commands the user equipment (the transmitter, or hand held) HH to change its output power Po. This command PCB is sent to the user equipment HH that must receive and decode it to obtain the command PC for controlling the power state of the user equipment HH. The user equipment HH may introduce an unknown delay from the instant the command PCB is transmitted by the base station BS until the command PC is decoded. In the embodiment in accordance with the invention, these delays will not influence the time available to change the level(s) of the non-selected power supply voltage(s).

Special situations occur if the power amplifier PA is operating at the minimum or maximum power supply voltage available. If the power supply voltage PV of the power amplifier has its minimum value, the selected power supply voltage has the minimum value, and at least one of the non-selected power supply voltages has a value a predetermined amount higher than the minimum value. The level of the other non-selected power supply voltage is not important, this level may be the minimum level or the predetermined higher level, or even a higher level. In the same manner the levels can be selected with respect to the maximum level.

FIG. 6 shows another embodiment in accordance with the invention wherein two power supply voltages are varied.

In this embodiment, the power supply PS supplies three power supply voltages PV1, PV2 and PV3. Three successive time slots n−1, n and n+1 are shown. Now, by way of example, the transition periods Tsw occur at the start of the time slots n−1, n and n+1. During the time slot n−1, the controller CO controls the switch S to supply the power supply voltage PV1 to the power amplifier PA as the power supply voltage PV. The non-selected power supply voltage PV2 has a predetermined higher level than the selected power supply voltage PV1. The non-selected power supply voltage PV3 has a predetermined lower level than the selected power supply voltage PV1.

The output power Po of the power amplifier PA has a higher level during the time slot n than during the time slot n−1. During the transition period Tsw starting at instant t10, preferable substantially at the instant t10, the controller CO controls the switch S to select the power supply voltage PV2 as the power supply voltage PV of the power amplifier PA. During the time slot n, the now non-selected power supply voltage PV1 is varied to obtain the predetermined level above the level of the selected power supply voltage PV2. The level of the non-selected power supply voltage PV3 is increased to obtain the predetermined lower level than the level of the now selected power supply voltage PV2. Before or at the end of the time slot n, at instant t20, again a higher and a lower power supply voltage PV1, PV3 than the selected power supply voltage PV2 are available. If again the output power Po of the transmitter has to increase, during the transition period Tsw staring at instant t2, preferably substantially at instant t20, the changed power supply voltage PV1 is selected. During the time slot n+1, outside the transition period Tsw, the power supply voltage PV1 is kept constant, while both the non-selected power supply voltages PV2, PV3 are varied to obtain the predetermined higher and lower level than the level of the now selected power supply voltage PV1. Before the end of the time slot n+1, again a higher and a lower power supply voltage PV3, PV1 will be available to select from.

The non-selected power supply voltage which has the level nearest to the selected power supply voltage is changed to cross the level of the selected power supply voltage. The variation of both the non-selected power supply voltages has the advantage that the maximum variation is less than if only one of the non-selected power supply voltages is varied.

FIG. 7 shows a variation of voltages in an embodiment in accordance with the invention. The required power supply voltage PV of the power amplifier PA is indicated by the waveform RPASV. The optimum level of the power supply voltage PV is indicated by the waveform OPASV. The level of the first power supply voltage PV1 is indicated by the waveform LPV1. The level of the second power supply voltage PV2 is indicated by the waveform LPV2. The actual level of the power supply voltage PV of the power amplifier PA is indicated by the waveform LPASV.

If the power change command PCB indicates that the output power Po has to increase, it is checked whether the non-selected power supply voltage is high enough such that the power amplifier PA is able to supply the output power Po requested during the next time slot. If the non-selected power supply fits these requirements, it will be selected at the next transition period Tsw. If the non-selected power supply does not fit these requirements, its level is increased immediately when the power change command PCB is received, and is then selected at the next transition period Tsw to be used as the power supply voltage PV of the power amplifier PA.

After the command PCB indicates that the output power Po has to decrease, it is checked whether the non-selected power supply voltage has the correct level to supply the power amplifier PA in the next time slot, allowing it to supply the output power Po requested during the next time slot. This correct level is lower than the level of the currently-selected power supply voltage. If the non-selected power supply voltage fits these requirements, it will be selected at the next transition period Tsw. If the non-selected power supply voltage does not fit these requirements, its level is decreased immediately when the power change command is received PCB, and is then selected at the next transition period Tsw to be used as the power supply voltage PV of the power amplifier PA.

FIG. 8 shows a variation of voltages in an embodiment in accordance with the invention. The required power supply voltage PV of the power amplifier PA is indicated by the waveform RPASV. The optimum level of the power supply voltage PV is indicated by the waveform OPASV. The level of the first power supply voltage PV1 is indicated by the waveform LPV1. The level of the second power supply voltage PV2 is indicated by the waveform LPV2. The actual level of the power supply voltage PV of the power amplifier PA is indicated by the waveform LPASV.

If the power change command PCB indicates that the output power Po has to increase, it is checked whether the non-selected power supply voltage is high enough such that the power amplifier PA is able to supply the output power Po requested during the next time slot. If the non-selected power supply voltage fits these requirements, it will be selected at the next transition period Tsw. If the non-selected power supply does not fit these requirements, its level is increased immediately when the power change command PCB is received, and is then selected at the next transition period Tsw to be used as the power supply voltage PV of the power amplifier PA.

After the command PCB indicates that the power has to decrease, the selected power supply voltage is allowed to decrease by discharging the smoothing capacitor when the output power Po is allowed to decrease. The non-selected power supply voltage may keep its high level. If the command PCB indicates that the power should increase this high level power supply voltage is selected. If the level is too high, the level of this power supply voltage is lowered by discharging the smoothing capacitor until the optimum level is reached. The discharging of the smoothing capacitor may be reached by temporarily switching off the power supply, or by regulating the power supply such that it supplies less power than required.

It should be noted that the above-mentioned embodiments illustrate rather than limit the invention, and that those skilled in the art will be able to design many alternative embodiments without departing from the scope of the appended claims.

The adaptive biasing of the power amplifier PA such that the power supply voltage PV is adapted to fit the average output power which is know in advance, can be used, for example in GSM, UMTS, CDMA, IS95, CDMA2000 and W-CDMA mobile communication systems, and in all other wireless systems is which an output power variation is required.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A transmitter comprising: a power amplifier having an amplifier power-supply input and an output for supplying a transmission signal with an output power, a power supply having power supply outputs for supplying a first power supply voltage and a second power supply voltage, a switching circuit arranged between the power supply outputs and the amplifier power-supply input, and a controller having an input for receiving a power change command to control: (i) the switching circuit to supply the first power supply voltage to the amplifier power-supply input, and the power supply to vary a level of the second power supply voltage to be lower than a level of the first power supply voltage if the power change command indicates that the output power has to decrease and to be higher than the level of the first power supply voltage if the power change command indicates that the output power has to increase, and (ii) the switching circuit to supply the second power supply voltage to the amplifier power-supply input; wherein the power supply supplies a third power supply voltage, the controller controls (i) the level of the second power supply voltage to above a level of the first power supply voltage, and a level of the third power supply voltage to below the level of the first power supply voltage, (ii) the switching circuit to supply either the second power supply voltage or the third power supply voltage to the amplifier power-supply input, depending on whether the output power has to increase or decrease, respectively.

2. A transmitter as claimed in claim 1, wherein the transmitter is arranged for operation in a transmission system based on time slots (n), and wherein the controller is adapted to control, in one of the time slots (n−1, n, n+1) wherein the output power has to be changed, the level of the second power supply voltage or the level of the third power supply voltage, depending on whether the level of the second power supply voltage or the level of the third power supply voltage has the largest difference with the level of a power supply voltage supplied to the amplifier power-supply input.

3. A transmitter as claimed in claim 1, wherein the transmitter is arranged for operation in a transmission system based on time slots (n), and wherein the controller is adapted to control, in one of the time slots (n−1, n, n+1) wherein the output power has to be changed, the power supply to adapt (i) the level of the first power supply voltage and the level of the third power supply voltage if the second power supply voltage is supplied to the amplifier power-supply input, wherein the level of the first power supply voltage is controlled for crossing the level of the second power supply voltage, or (ii) the level of the first power supply voltage and the level of the second power supply voltage if the third power supply voltage is supplied to amplifier power-supply input, wherein the level of the first power supply voltage is controlled for crossing the level of the third power supply voltage.

* * * * *